United States Patent
Hanke et al.

(12) 
(10) Patent No.: US 6,735,656 B2
(45) Date of Patent: May 11, 2004

(54) PC CARD HAVING CASING PART EDGES JOINED BY FINGERS IN RECESSES AND TABS IN SLOTS

(75) Inventors: Brigitte Hanke, Ramshalden (DE); Gerhard Geiselmann, Hochdorf (DE)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 528 days.

(21) Appl. No.: 09/775,147

(22) Filed: Jan. 31, 2001

(65) Prior Publication Data
US 2001/0014926 A1 Aug. 16, 2001

(30) Foreign Application Priority Data
Feb. 16, 2000 (DE) .......................... 100 06 848

(51) Int. Cl.⁷ .......................... H01R 13/00; G06F 13/00
(52) U.S. Cl. ................ 710/301; 361/600; 361/737; 361/748; 439/55; 235/375
(58) Field of Search ................ 710/300, 303, 710/301, 302; 361/737, 740, 685, 802, 741, 752, 796, 725, 756, 600; 403/6; 439/43, 55, 945, 76.1, 946, 328; 235/375–382.5

(56) References Cited

U.S. PATENT DOCUMENTS 5,469,332 A * 11/1995 Alvit'e
5,477,421 A * 12/1995 Bethurum
5,536,180 A * 7/1996 Ishida et al.
5,844,780 A * 12/1998 Deguchi
6,106,309 A * 8/2000 Kakinoki
6,186,801 B1 * 2/2001 Kakinoki

FOREIGN PATENT DOCUMENTS

EP 0419694 A1 9/1989

OTHER PUBLICATIONS

"Time and frequency domain analysis for right angle corners on printed circuit board traces" by M. I. Montrose (abstract only).*

"Thermal design rules for electronic components on conducting boards in passively cooled renclosures" by B. S. Lall, A. Orteg and H. Kabir (abstract only).*

* cited by examiner

*Primary Examiner*—Gopal C. Ray
(74) *Attorney, Agent, or Firm*—Roger C. Turner (57) ABSTRACT

A PC card has a casing with upper and lower casing portions (12,11) wherein the upper casing portion is formed by front and rear casing parts (13, 14). The rear casing part has a forward edge portion (102) with forwardly-projecting fingers (29) that each has a free front end. The front casing part has a rear edge portion (104) with a location (112) that lies on top of the forward edge portion to prevent downward movement of the rear edge portion, and with the rear edge portion having downward recesses (49) parts with bottom walls (48) that lies closely under the fingers to prevent upward movement of the rear edge portion.

7 Claims, 9 Drawing Sheets

FIG. 5B ized PC CARD HAVING CASING PART EDGES JOINED BY FINGERS IN RECESSES AND TABS IN SLOTS

CROSS-REFERENCE

This patent application claims priority from German patent application 100 06 848.0-34 filed Feb. 16, 2000.

BACKGROUND OF THE INVENTION

PC cards, such as those offered as memory cards, modem cards, fax cards and the like in the standards of PCMCIA (Personal Computer Memory Card International Association), have a circuit board whose front end is coupled to a front connector molded plastic body, and whose rear end may be coupled to a rear molded plastic body. The PC card has a casing formed of top and bottom sheet metal casing halves, or parts. Each casing part has bent tabs at its ends that fit into vertical slots in the plastic bodies at the front and rear ends of the card. The casing parts are held in place by fitting them together, and are held to the plastic bodies by the tabs until the casing parts can be laser welded together. In practice, the casing parts can shift positions prior to welding them together, which makes it difficult to accurately weld or otherwise fix the casing parts together tightly around the plastic bodies. A casing for a PC card which enabled the casing to be easily preassembled in an assembly that minimized shifting of the casing parts prior to final latching or laser welding, would be of value. Such assembly would be especially valuable for a PC card with a rear extension which had a plastic upper wall. Such plastic upper wall can be useful in application such as where the extension contains an antenna designed to receive and radiate signals and to simplify mechanical connection.

SUMMARY OF THE INVENTION

In accordance with one embodiment of the present invention, a PC card is provided with a casing having parts that be easily assembled and that then hold themselves together with minimum shifting prior to welding or other final fixing connection. The invention is especially useful to hold a rear extension of a casing in place. The upper casing portion includes front and rear casing parts. The rear casing part has a forward edge portion with at least one forwardly-projecting finger having a free front end. The front casing part is formed of sheet metal and has a rear edge portion with a downwardly depressed part forming a recess with a bottom wall and an open rear end. The finger is receive in the recess, the bottom wall of the recess lying closely under the finger to prevent upward movement of the rear edge portion of the casing. At the same time, the rear edge portion lies on top of the front edge portion to prevent downward movement of the rear edge portion The novel features of the invention are set forth with particularity in the appended claims. The invention will be best understood from the following description when read in conjunction with the accompanying drawings.

DESCRIPTION OF THE PREFERRED EMBODIMENTS

Figure 1:
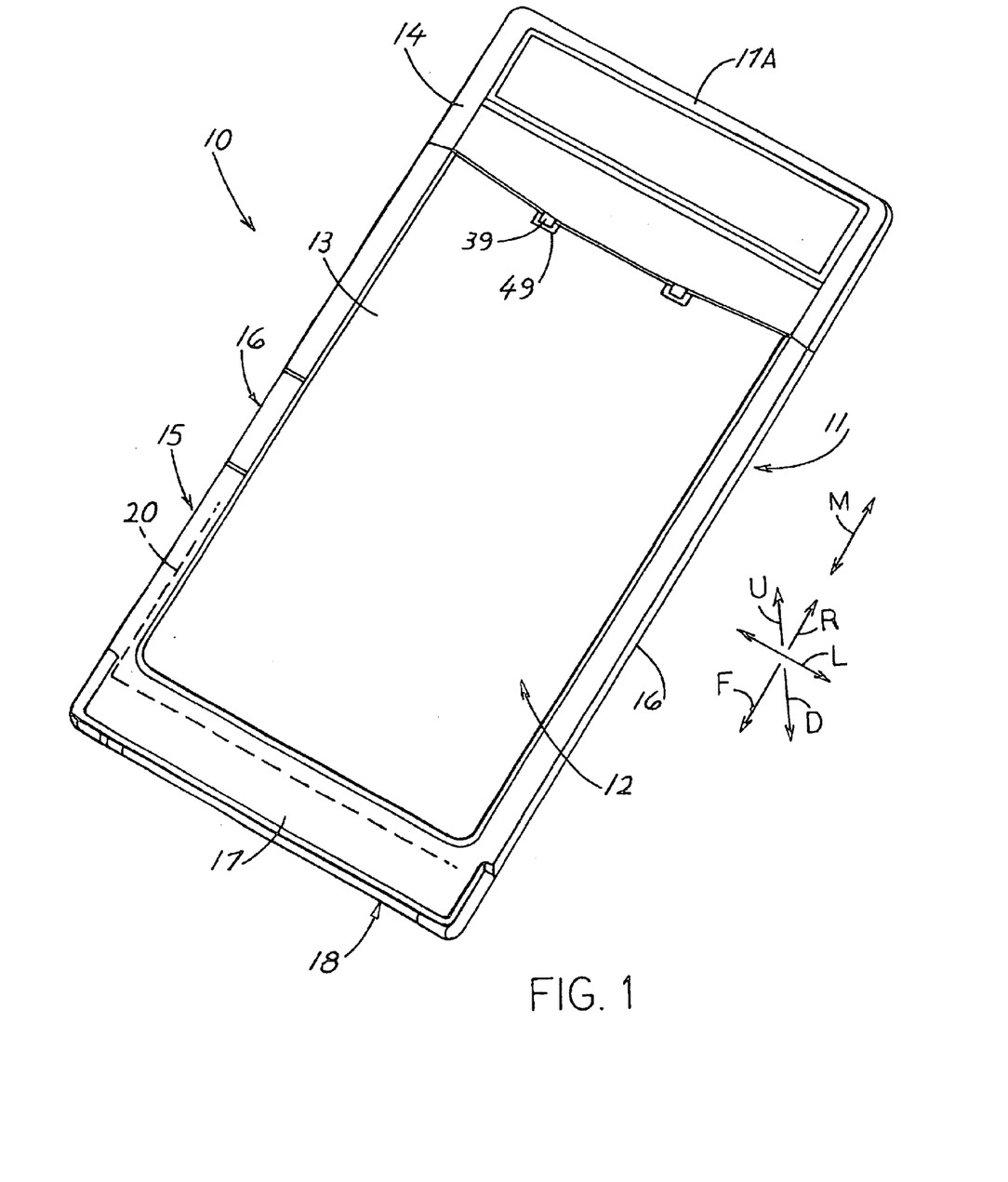
FIG. 1 is a top isometric view of a PC card constructed in accordance with one embodiment of the present invention.

FIG. 1 illustrates a PC card 10 constructed in accordance with PCMCIA standards that specify a width in a lateral direction L of 54 mm and a height in up and down directions U, D of a maximum of 5 mm for the most popular type, Type II card, with the vertical dimensions varying for other types. The length of the card in front F and rear R longitudinal directions M is usually 85.6 mm, but some cards have rear extensions, as does the card of FIG. 1. The card includes a circuit board 20, a front connector 18 with a molded body and with contacts connected to traces on the front end of the circuit board, and a casing 15 that surrounds the circuit board. The casing includes a lower casing portion 11 formed in substantially a single part, and an upper casing portion 12 formed of a front casing part 13 and a rear casing part 14. The card is of parallepiped shape, with laterally opposite sides 16, a top and bottom, and longitudinally opposite ends 17, 17A.

Figure 2A:
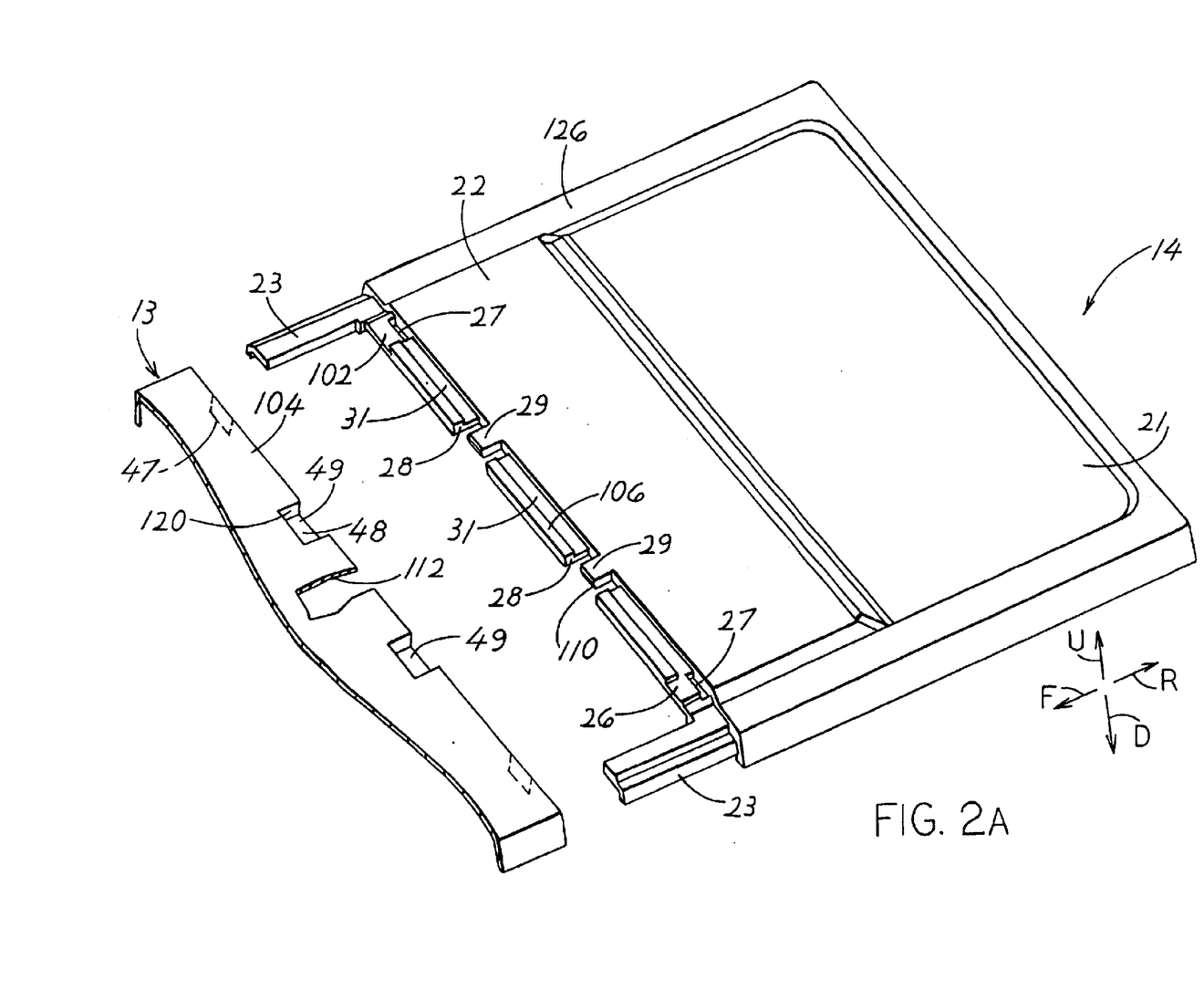
FIG. 2A is a top isometric view of the rear part of the casing of the PC card of FIG. 1, and showing the rear edge portion of the upper front part of the casing.

FIG. 2A shows that the rear casing part 14 is formed of a molded polymer, or plastic, with a pair of forwardly projecting bars 23 at opposite sides. The rear of the circuit board is received between the bars. The particular rear casing part 14 includes an upper section 126 with a rear region 21 of small height and with a forward region 22 of greater height which can be used to receive large electronic components at the rear of the circuit board.

The rear casing part 14 has a forward edge portion 102 where mechanical connections are made to the rear edge portion 104 of the upper front casing part 13. The forward edge portion 102 has a slightly depressed rim region 31. The forward edge portion has a pair of vertical through slots 27, while the rear edge portion has a pair of downwardly-bent tabs 47 that fit into the slots.

The forward edge portion 102 has a pair of forwardly-projection fingers 29 with free front ends 110. The rear edge portion 104 has a pair of downward depressions or recesses 49 that are designed to receive the fingers. When the fingers are fully received, they lie substantially against a bottom wall 48 of each recess, to prevent upward movement of the rear edge portion 104. At the same time, a large lateral length area 112 of the rear edge portion 104 lies on top of a region 106 of the forward edge portion 102 to prevent downward movement of the rear edge portion. The forward edge portion 102 has a pair of grooves 28, and each finger 29 lies in one of the grooves, with the opposite sides of the finger spaced from the opposite sides of the groove, and with the front end of the finger lying slightly rearward of the front end of the groove walls. When the forward and rear edge portions are brought togther, opposite sides 120 of the recess lie closely adjacent to the opposite sides of the groove 28. As a result, engagement of the opposite sides of each groove with the sides 120 of the recess wall helps to prevent relative lateral movement of the front case part 13 with respect to the rear case part 14.

Figure 2B:
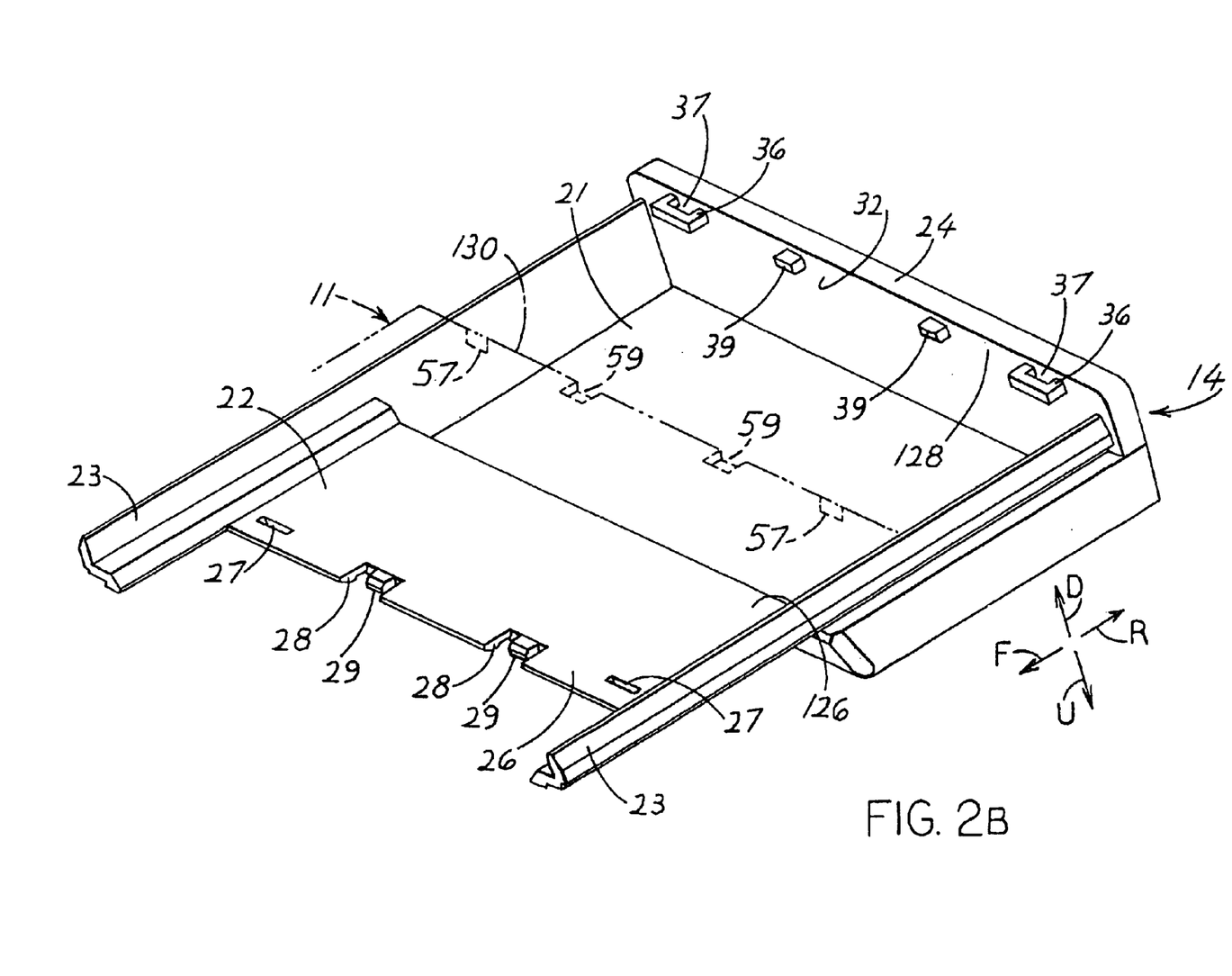
FIG. 2B is an upside-down bottom isometric view of the rear part of the casing and showing, in phantom lines, the rear edge portion of the lower front part of the casing.

FIG. 2B, which shows the rear case part 14 in an upside-down position, shows that the rear case part has a bottom section 128 with a pair of vertical through slots 37 and a pair of forward-projecting fingers 39. The slots and fingers lie at a front face 32 of the bottom of rear wall 24 of the rear case part. The rear wall extends along the entire height of the rear end of the case. The lower casing portion 11 has a lower rear edge portion 130 with a pair upwardly-extending tabs 57 that extend upwardly through the slots 37, and has a pair of recesses 59 that receive the fingers 39, all in a manner similar to that shown in FIG. 2A for the upper portion of the casing. It is noted that the through slots 37 are formed by forward protrusions 36 that project forwardly from the front face of the rear wall 24, and that the lower rear edge portion 130 of the lower casing portion 11 has locations adjacent to the tabs 57, that lie on the protrusions 36 to prevent the edge portion 130 from moving upward U. The lateral spacing between each slot 37 and an adjacent finger 39 is approximate equal to the spacing between the two fingers 39.

Figures 3A, 3C, 3D:
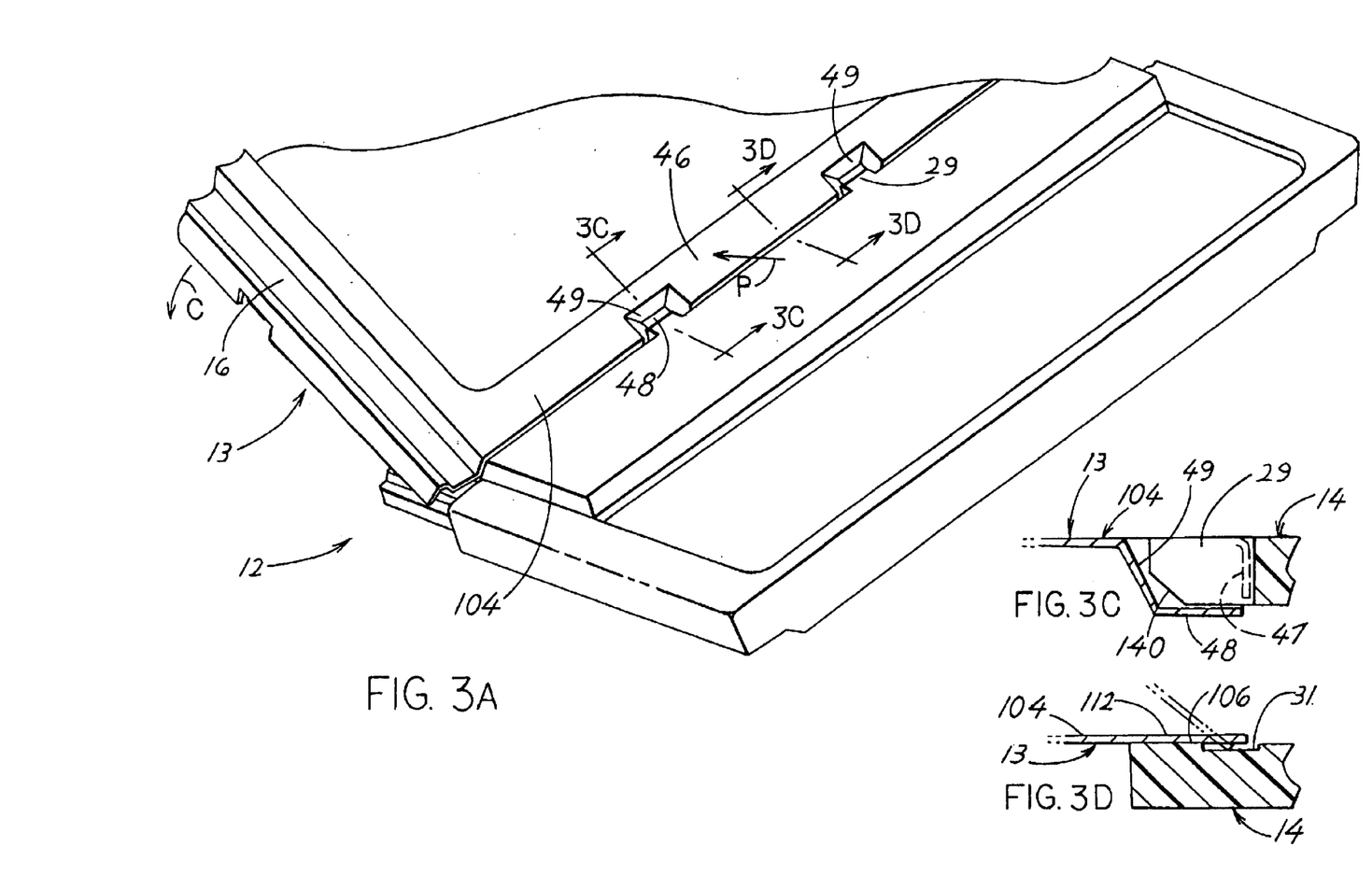
FIG. 3A is a partial top and front isometric view of the casing of the PC card FIG. 1, showing it during a process of assembly.
FIG. 3C is a sectional view taken on line 3C—3C of FIG. 3A, after assembly.
FIG. 3D is a sectional view taken on line 3D—3D of FIG. 3A, after assembly.
Figure 3B:
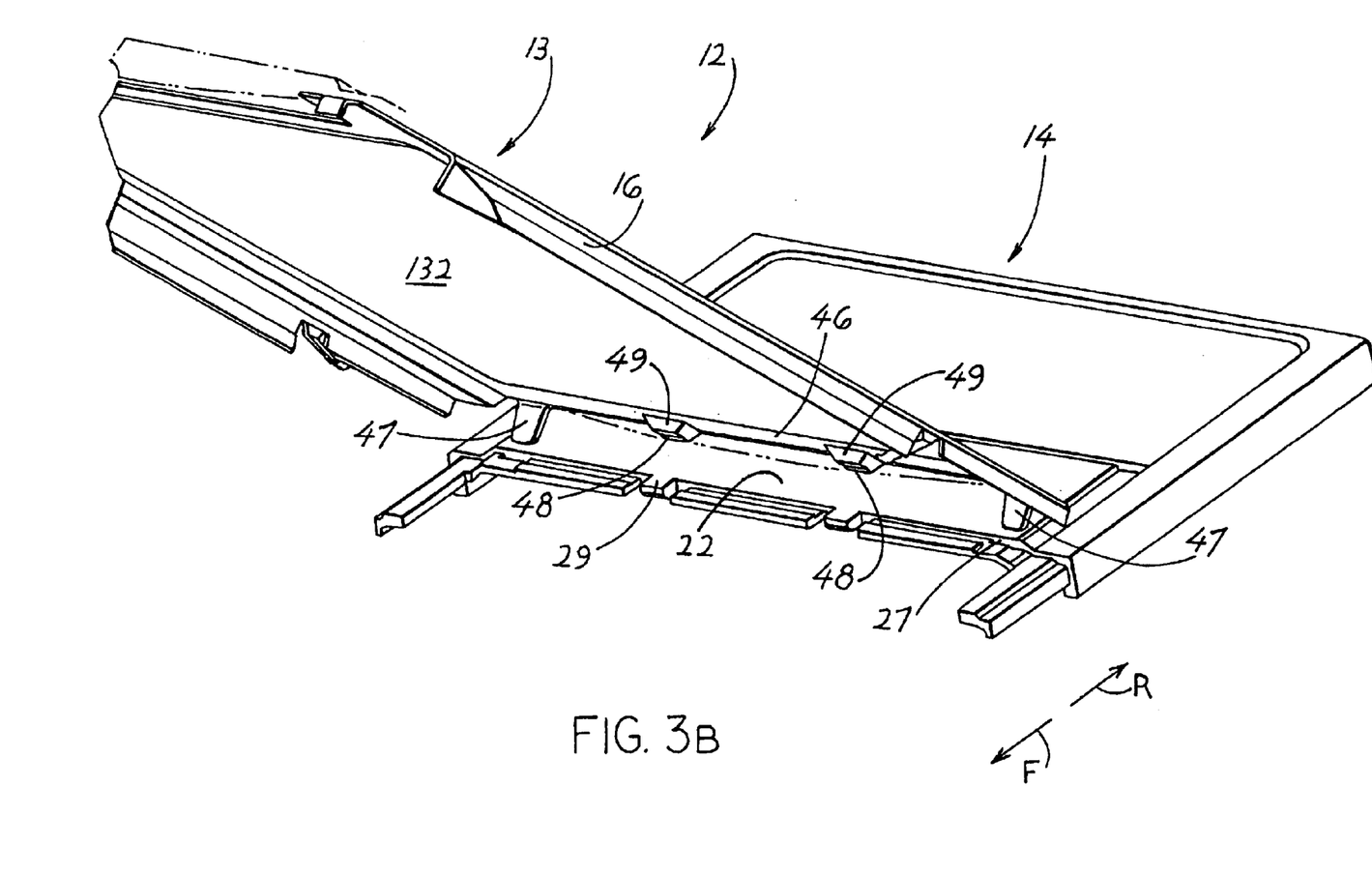
FIG. 3B is a partial rear and top isometric view of the casing of FIG. 3A shown during its assembly.

FIG. 3B shows the beginning of assembly of the upper front casing part 13 to the rear casing part. The tabs 47 are bent over at right angles with respect to the sheet metal plate region 132. FIG. 3B also shows the recesses 49 with bottom walls 48 that fit closely under the fingers 29 (within about 0.1 mm under the fingers).

To assemble the upper front casing part 13 to the rear casing part 14, the front casing part is oriented so its plate region 132 lies at an upward-forward incline to the upper surface at 22 of the rear casing part 14. To enable such assembly, the slots 27 are made slightly thicker than the thickness of the tabs 47. Once the tabs have been projected downwardly through the slots 27, the bottom recess walls 48 are positioned below and against the fingers 29. With the upper rear casing part 13 in the configuration shown in FIG. 3A, the rear edge portion 104 of the upper front casing part is pressed downward in the region 46 between the two recesses 49, as indicated by arrow P. The sheet metal in the region 46 is elastically deflected downward so that the bottom walls 48 of the recesses slide under the fingers 29. The recessed region 31 (FIG. 2A) enables reception of the rear edge of the tilted upper front part. The upper front casing part 13 is then pivoted downward in the direction of arrow C towards the printed circuit board, or towards the lower casing portion 11, so the fingers locate themselves completely in the recesses 49.

FIGS. 3C and 3D are taken on lines 3C—3C and 3D—3D of FIG. 3A. FIG. 3C shows the bottom recess wall 48 lying against the bottom of the finger 29. It is noted that the finger has a bottom front portion 140 that extends at a forward-upward incline, which helps during installation. The bottom recess wall 48 prevents the rear edge portion 104 of the upper front case part 13 from moving upward. FIG. 3D shows that the rear edge area 112 of the rear edge portion lies against the region 106 that is raised with respect to the recess 31, to prevent the rear edge portion 104 from moving downward. By preventing both upward and downward movement, applicant prevents all relative vertical movement of the front and rear casing portions 13, 14. The tabs 47 prevent relative longitudinal and lateral movement.

Figure 4A:
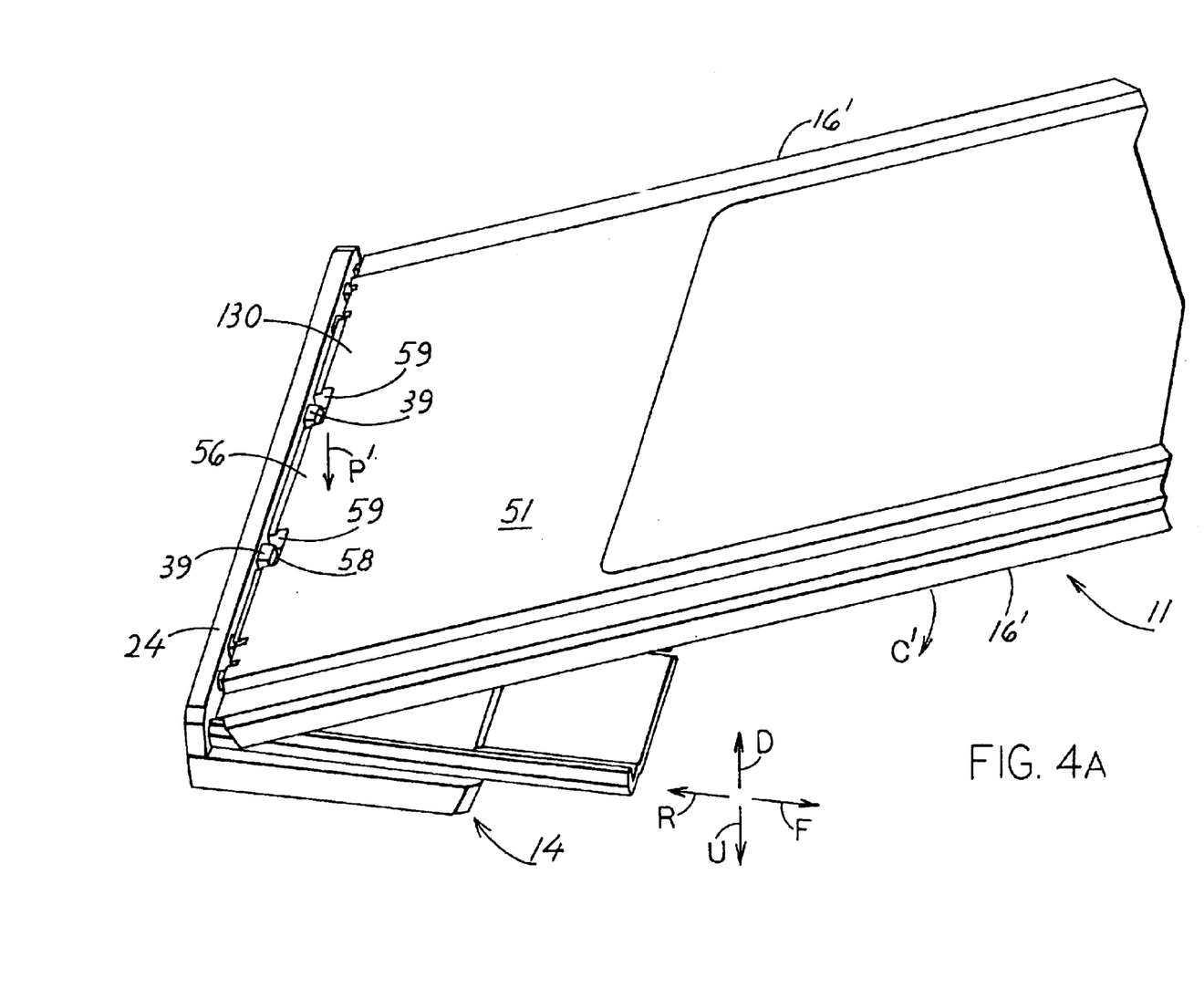
FIG. 4A is an upside-down bottom isometric view of a portion of a casing of the PC card of FIG. 1, shown during the process of joining the lower front casing part to the rear part of the casing.
Figure 4B:
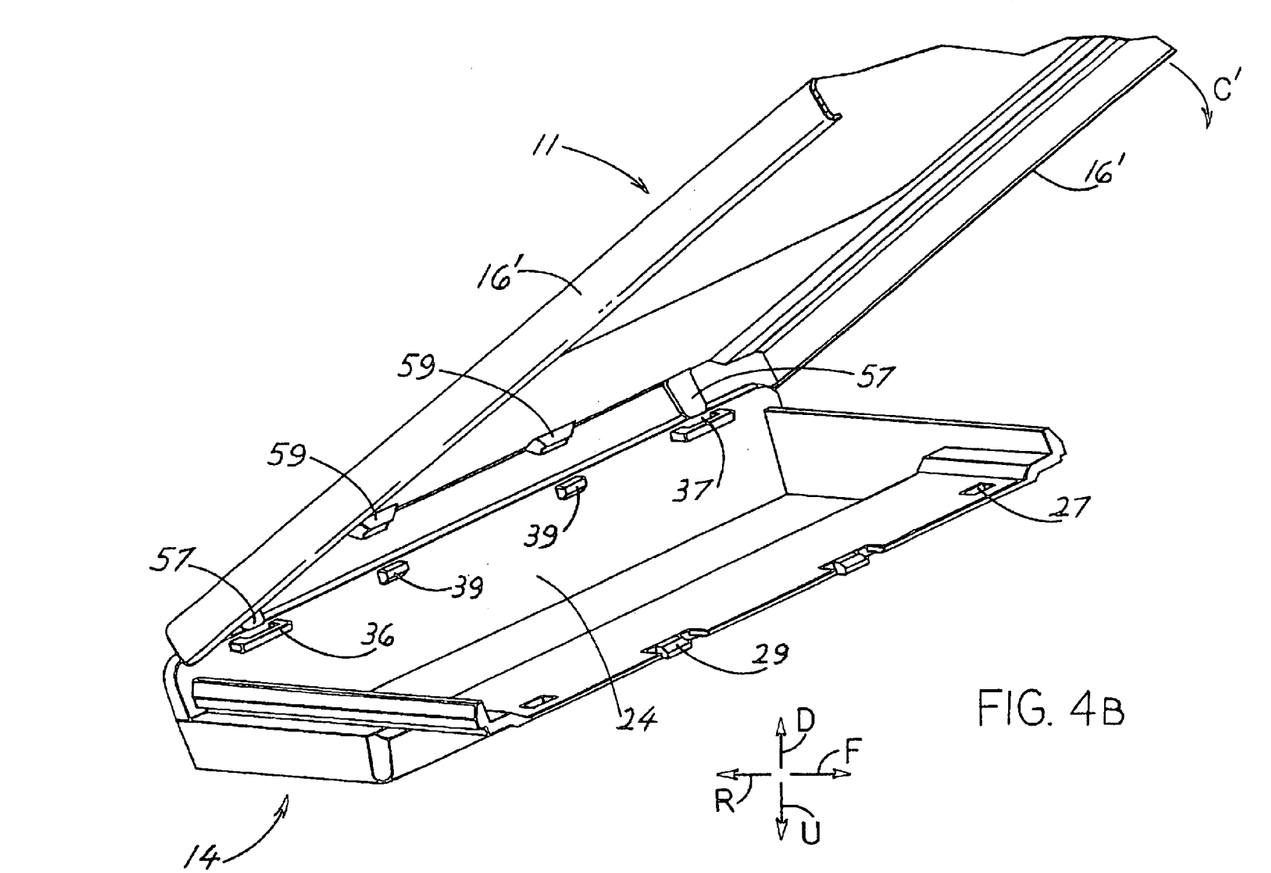
FIG. 4B is a rear isometric view of the assembly FIG. 4A.

FIGS. 4A and 4B show the corresponding assembling of the lower casing portion 11 on the plastic rear casing part 14. The rear edge portion 130 is positioned at an incline and the region 56 is depressed as shown by arrow P' so the recesses 59 receive the fingers 39. Then, opposite sides 16' of the lower casing portion or part are pivoted upward in the direction of arrow C'.

Figure 5A:
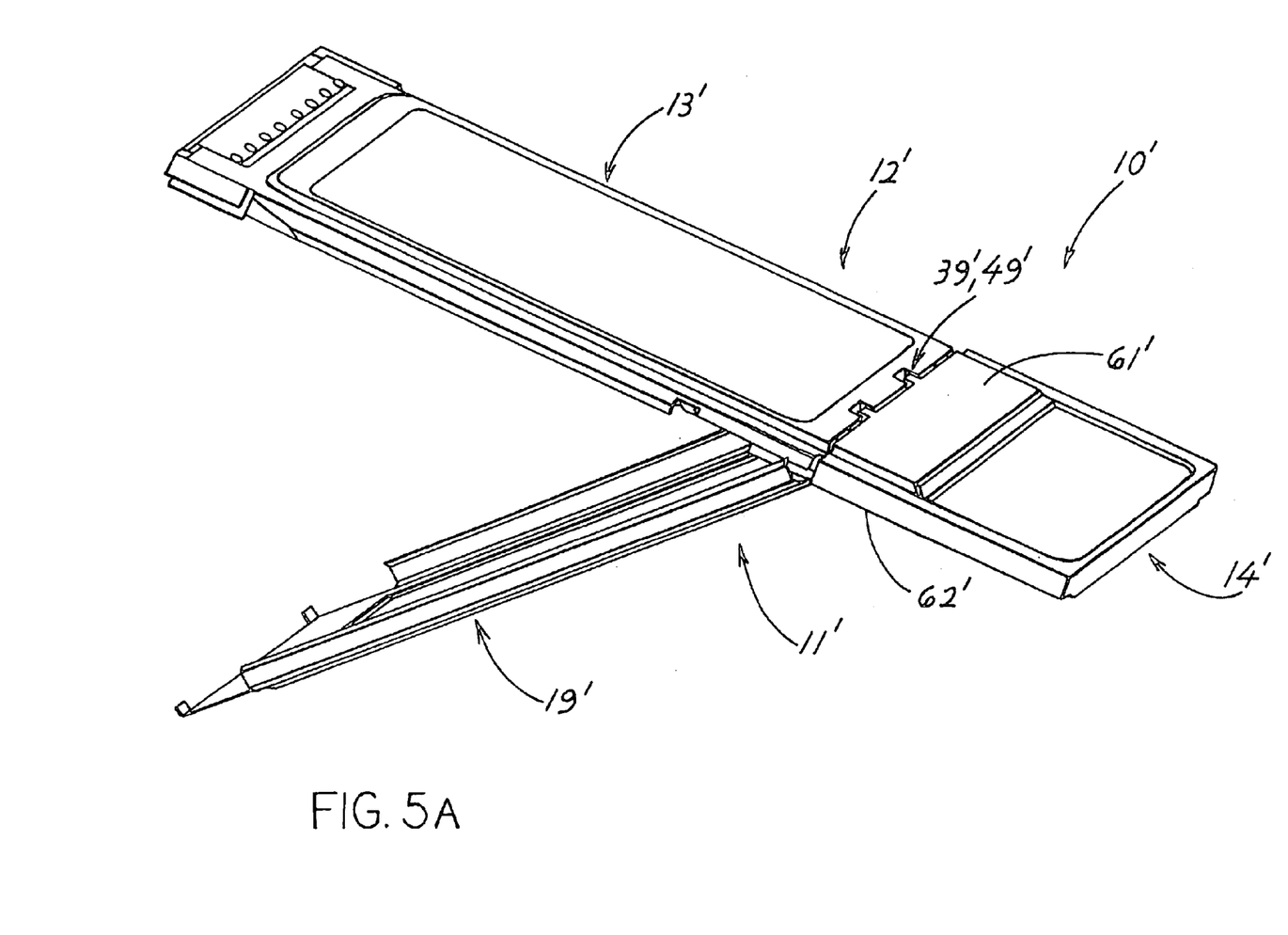
FIG. 5A is a top isometric view of a PC card of another embodiment of the invention, shown during the assembly of the casing.
Figure 5B:
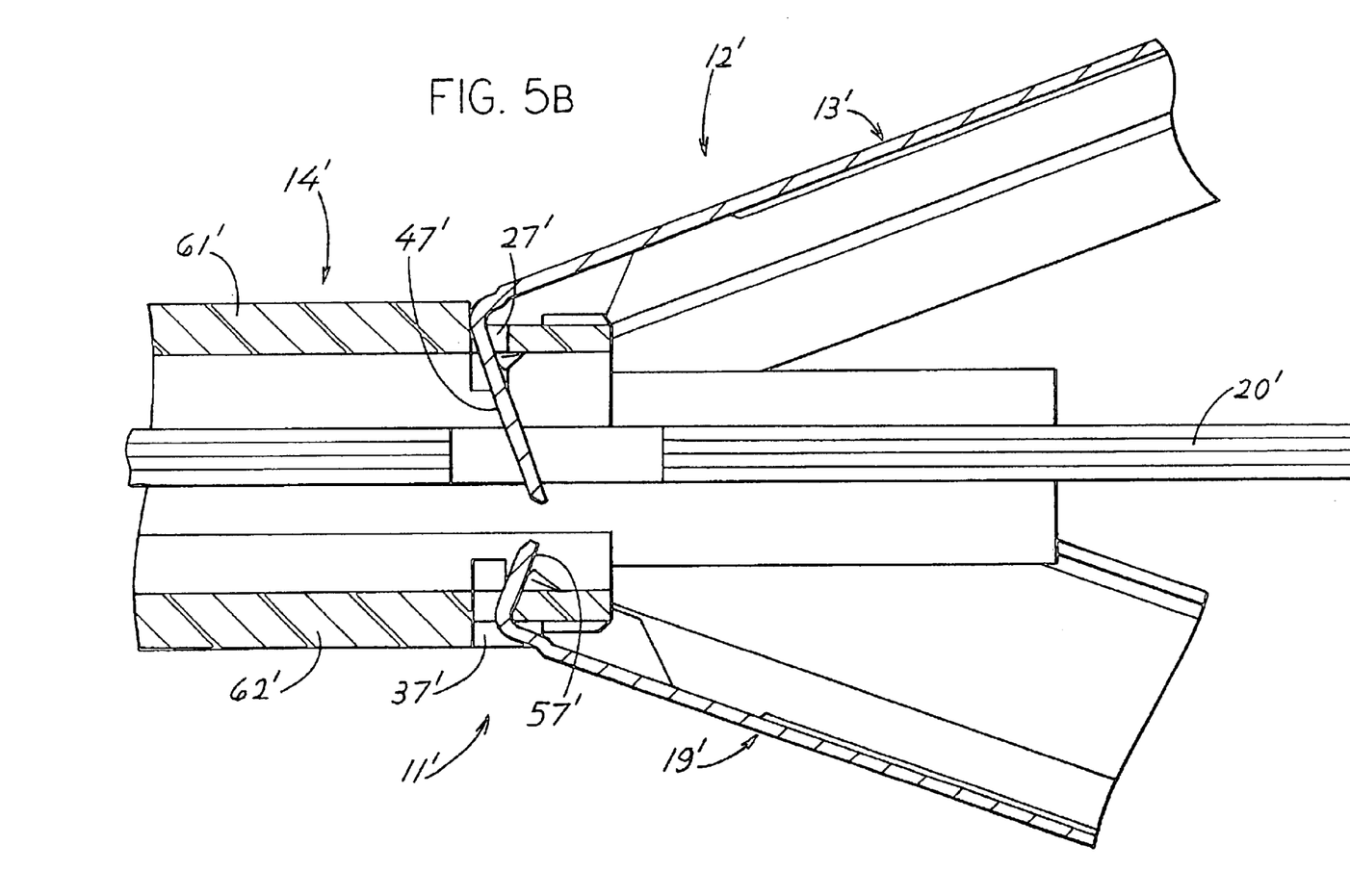
FIG. 5B is a sectional view of a portion of the assembly of FIG. 5A.

FIGS. 5A and 5B show another PC card 10', where both the lower and upper casing portions 11', 12' are divided. That is, the lower casing portion 11' includes a sheet metal lower casing part 19' of about the same length as the upper front casing part 13'. The rear casing part 14' has upper and lower largely planar parts 61', 62' with front edge portions that lie substantially one directly over the other. Fingers and recesses 39', 49' that join the rear ends of the upper and lower casing parts 13', 19' lie substantially one over the other.

FIG. 5B shows that the tabs 47' of the upper front casing part 13' are long enough that they lie in recesses of the circuit board 20' after passing through slots 27. Shorter tabs 57' at the bottom lie in slots. The lower and upper casing portions 11', 12' each includes a sheet metal front part 19', 13' and a molded polymer rear part 14' with top and bottom plate portions 61', 62'.

While terms such as "upper", "lower", etc. have been used to help describe the invention as it is illustrated, it should be noted that the PC card and its parts can be used in any orientation with respect to the Earth.

Thus, the invention provides a PC card with a casing surrounding a circuit board, where the casing includes three parts, including sheet metal upper and lower parts that lie above and below most or all of the circuit board, and a molded plastic rear part that forms a rearward extension of the card. The molded plastic rear part has forwardly projecting fingers at its top and bottom, while each sheet metal front part has recesses with open rear ends that receive the fingers. For the upper casing portion, the recess bottom walls lie closely against the bottom of the fingers while a region of the rear edge portion lies on top of the forward edge portion of the plastic rear part, to prevent relative vertical movement of the adjoining portions of the front and rear parts. A similar coupling is used at the rear end of the bottom sheet metal part.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card which has a thickness in a vertical direction, a width in a lateral direction, and a length in forward and rearward longitudinal directions, where said width and length are each a plurality of times as great as said thickness, where said card has a circuit board, and a casing that surrounds said circuit board with said casing including upper and lower casing portions including an upper front casing part and a rear casing part, wherein:

said rear casing part has a top wall lying primarily in a first horizontal plane, with said top wall having a laterally-extending forward edge portion with a pair of largely vertical through slots and with said forward edge portion having at least one forwardly-projecting finger with a free front end;

said upper front casing part is formed of sheet metal that lies primarily in a second horizontal plane and that has a laterally-extending rear edge portion with a pair of tabs that extend downwardly through said slots, with said rear edge portion having a location lying on top of said forward edge portion to prevent downward movement of said rear edge portion, and with said rear edge portion having a downwardly depressed recessed part with a bottom recess wall that lies closely under said fingers to prevent upward movement of said rear edge portion; and said forward edge portion has a pair of laterally spaced forwardly-projecting fingers elements including said finger, and said rear edge portion has a pair of laterally-spaced downwardly depressed recessed regions including said recessed part, with each of said recessed regions lying under one of said finger elements.

2. A PC card which has a thickness in a vertical direction, a width in a lateral direction, and a length in forward and rearward longitudinal directions, where said width and length are each a plurality of times as great as said thickness, where said card has a circuit board, and a casing that surrounds said circuit board with said casing including upper and lower casing portions including an upper front casing part and a rear casing part, wherein:

said rear casing part has a top wall lying primarily in a first horizontal plane, with said top wall having a laterally-extending forward edge portion with a pair of largely vertical through slots and with said forward edge portion having at least one forwardly-projecting finger with a free front end;

said upper front casing part is formed of sheet metal that lies primarily in a second horizontal plane and that has a laterally-extending rear edge portion with a pair of tabs that extend downwardly through said slots, with said rear edge portion having a location lying on top of said forward edge portion to prevent downward movement of said rear edge portion, and with said rear edge portion having a downwardly depressed recessed part with a bottom recess wall that lies closely under said fingers to prevent upward movement of said rear edge portion; and the vertical depth of said depression is equal to the vertical thickness of said finger, whereby said first and second planes lie at substantially the same height.

3. A PC card which has a thickness in a vertical direction, a width in a lateral direction, and a length in forward and rearward longitudinal directions, where said width and length are each a plurality of times as great as said thickness, where said card has a circuit board, and a casing that surrounds said circuit board with said casing including upper and lower casing portions including an upper front casing part and a rear casing part, wherein:

said rear casing part has a top wall lying primarily in a first horizontal plane, with said top wall having a laterally-extending forward edge portion with a pair of largely vertical through slots and with said forward edge portion having at least one forwardly-projecting finger with a free front end;

said upper front casing part is formed of sheet metal that lies primarily in a second horizontal plane and that has a laterally-extending rear edge portion with a pair of tabs that extend downwardly through said slots, with said rear edge portion having a location lying on top of said forward edge portion to prevent downward movement of said rear edge portion, and with said rear edge portion having a downwardly depressed recessed part with a bottom recess wall that lies closely under said fingers to prevent upward movement of said rear edge portion;

said forward edge portion has a forward edge and has a groove that extends rearwardly into said forward edge, with said groove having laterally-spaced opposite groove sides, and said finger lies in said groove between and spaced from said opposite groove sides; and said recessed part of said rear edge portion has laterally opposite recess side walls that lie between and adjacent to said groove sides, to limit relative lateral movement.

4. A PC card which has a thickness in a vertical direction, a width in a lateral direction, and a length in forward and rearward longitudinal directions, where said width and length are each a plurality of times as great as said thickness, where said card has a circuit board and a casing that surrounds said circuit board with said casing including a plurality of planar casing parts that are joined together, wherein:

a first of said casing parts has a laterally-extending forward edge portion with at least one forwardly-projecting finger with a bottom finger surface;

a second of said casing parts is formed of sheet metal and has a laterally-extending rear edge portion, said rear edge portion having a region lying on top of said forward edge portion to prevent downward movement of said rear edge portion, and said rear edge portion having a downwardly depressed recess with a bottom recess wall that lies below and substantially against said bottom finger surface to prevent upward movement of said rear edge portion; and said first casing portion is molded of a polymer, with said finger having a vertical thickness that is plurality of times as great as said sheet metal of said second casing portion.

5. A PC card which has a thickness in a vertical direction, a width in a lateral direction, and a length in forward and rearward longitudinal directions, where said width and length are each a plurality of times as great as said thickness, where said card has a circuit board and a casing that surrounds said circuit board with said casing including a plurality of planar casing parts that are joined together, wherein:

a first of said casing parts has a laterally-extending forward edge portion with at least one forwardly-projecting finger with a bottom finger surface;

a second of said casing parts is formed of sheet metal and has a laterally-extending rear edge portion, said rear edge portion having a region lying on top of said forward edge portion to prevent downward movement of said rear edge portion, and said rear edge portion having a downwardly depressed recess with a bottom recess wall that lies below and substantially against said bottom finger surface to prevent upward movement of said rear edge portion;

said forward edge portion has a groove that extends rearwardly into said forward edge portion, with said groove having laterally-spaced opposite groove sides, and said finger lies in said groove between and spaced from said opposite groove sides; and said recess of said rear edge portion has laterally opposite recess side walls that lie between and adjacent to said groove sides to limit lateral shifting of said forward edge portion relative to said rear edge portion.

6. A PC card which has a thickness in a vertical direction, a width in a lateral direction, and a length in forward and rearward longitudinal directions, where said width and length are each a plurality of times as great as said thickness, where said card has a circuit board and a casing that surrounds said circuit board with said casing including a plurality of planar casing parts that are joined together, wherein:

a first of said casing parts has a laterally-extending forward edge portion with at least one forwardly-projecting finger with a bottom finger surface;

a second of said casing parts is formed of sheet metal and has a laterally-extending rear edge portion, said rear edge portion having a region lying on top of said forward edge portion to prevent downward movement of said rear edge portion, and said rear edge portion having a downwardly depressed recess with a bottom recess wall that lies below and substantially against said bottom finger surface to prevent upward movement of said rear edge portion;

said card has upper and lower primarily planar surfaces, and said first casing part is molded of a polymer and has upper and lower sections that lie at about the heights of said upper and lower planar surfaces, respectively, with said upper section forming said forward edge portion;

said lower section of said first casing part has a laterally-extending front region with at least one forwardly-projecting finger part with a free end; and said casing has a lower third casing part that extends along substantially the entire longitudinal length of said PC card, said third casing portion being formed of sheet metal and having a laterally extending rearward edge portion, said rearward edge portion having a location lying under said front region of said lower section to prevent upward movement of said rearward edge portion of said third casing part, and said rearward edge portion of said third casing part having an upwardly depressed area with a top wall that lies closely above said finger part to prevent downward movement of said rearward edge portion of said third casing part.

7. A PC card that has a width and that includes a casing and a circuit board lying in said casing, with said casing having an upper front casing part and a rear casing part that each have a lateral width equal to the width of said PC card, wherein:

said rear casing part is molded of plastic and has an upper laterally-extending front edge portion that includes a top surface, a pair of vertical slots and a pair of forwardly-protruding fingers;

said upper front casing part is formed of sheet metal and has a laterally-extending rear edge portion that includes a pair of tabs extending down through said vertical slots and that includes a pair of recesses with open rear ends and with bottom walls that each lies closely under and against said fingers to prevent upward movement of said front casing part, said upper rear edge portion having a location lying against said top surface of said front edge portion to prevent downward movement of said upper front casing part;

said rear casing part has a top and a bottom, with said rear casing part forming said upper front edge portion and with said rear casing part having a bottom rear end forming a lower forward edge portion, with said lower forward edge portion forming a pair of forward protrusions having lower vertical through slots and also forming a pair of forwardly protruding finger parts; and said upper casing includes a sheet metal bottom front casing part that lies directly under a majority of said upper front casing part, with said bottom front casing part having a rearward portion forming a pair of upwardly-extending tabs extending up through said lower vertical through slots and also forming a pair of upward depressions that each has an upper wall lying against a top of one said finger parts.

* * * * *